US006756293B2

(12) United States Patent
Li et al.

(10) Patent No.: US 6,756,293 B2
(45) Date of Patent: Jun. 29, 2004

(54) COMBINED GATE CAP OR DIGIT LINE AND SPACER DEPOSITION USING HDP

(75) Inventors: Weimin Li, Boise, ID (US); Sujit Sharan, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/319,694

(22) Filed: Dec. 16, 2002

(65) Prior Publication Data

US 2003/0124872 A1 Jul. 3, 2003

Related U.S. Application Data

(60) Continuation of application No. 09/989,036, filed on Nov. 21, 2001, now Pat. No. 6,524,975, which is a division of application No. 09/354,572, filed on Jul. 16, 1999, now Pat. No. 6,368,988.

(51) Int. Cl.[7] .......................................... H01L 21/4763
(52) U.S. Cl. ..................... 438/595; 438/778; 438/788; 438/792; 427/574; 427/569
(58) Field of Search ............................... 438/778, 788, 438/792, 595; 427/574, 569

(56) References Cited

U.S. PATENT DOCUMENTS

| | | | |
|---|---|---|---|
| 4,776,918 A | 10/1988 | Otsubo et al. ............ 156/345 |
| 4,877,641 A | * 10/1989 | Dory ......................... 427/574 |
| 4,882,028 A | 11/1989 | Chhabra ..................... 204/298 |
| 4,892,751 A | * 1/1990 | Miyake et al. ............ 427/572 |
| 5,091,049 A | 2/1992 | Campbell et al. ......... 156/643 |
| 5,124,014 A | * 6/1992 | Foo et al. .................. 438/694 |
| 5,286,344 A | 2/1994 | Blalock et al. ............ 156/657 |
| 5,290,358 A | 3/1994 | Rubloff et al. |
| 5,344,792 A | 9/1994 | Sandhu et al. ............ 437/200 |
| 5,451,543 A | 9/1995 | Woo et al. ................. 437/195 |
| 5,532,175 A | 7/1996 | Racanelli et al. ........... 437/29 |
| 5,629,246 A | 5/1997 | Iyer ........................... 438/763 |
| 5,641,545 A | 6/1997 | Sandhu ...................... 427/573 |
| 5,662,770 A | 9/1997 | Donohoe .................... 438/716 |
| 5,683,548 A | * 11/1997 | Hartig et al. ............... 438/729 |
| 5,736,455 A | 4/1998 | Iyer et al. .................. 138/592 |
| 5,747,116 A | 5/1998 | Sharan et al. .............. 427/534 |
| 5,759,922 A | 6/1998 | Donohoe .................... 438/731 |
| 5,762,814 A | 6/1998 | Ohara et al. ................. 216/70 |
| 5,776,834 A | 7/1998 | Avanzino et al. |
| 5,872,058 A | 2/1999 | Van Cleemput et al. |
| 5,913,140 A | 6/1999 | Roche et al. |
| 6,184,185 B1 | 2/2001 | Schufflebotham et al. |

OTHER PUBLICATIONS

Korczynski; "HDP–CVD: Trying to lasso lighting", Solid State Technology, Apr. 1996; pp. 63–73.
Kalkman et al.; "SiOF$_x$ and SiO$_2$ deposition in an ECR–HDP reactor; Tool characterisation and film analysis", Microelectronic Engineering 37/38 (1997) pp. 271–276.

(List continued on next page.)

*Primary Examiner*—Kamand Cuneo
*Assistant Examiner*—Lisa Kilday
(74) *Attorney, Agent, or Firm*—Dickstein Shapiro Morin & Oshinsky

(57) ABSTRACT

A method for fabricating gate electrodes and gate interconnects with a protective silicon oxide or silicon nitride cap and spacer formed by high density plasma chemical vapor deposition (HDPCVD). Silicon oxide or silicon nitride is deposited in a reaction zone of a HDPCVD reactor while providing two or more selected substrate bias powers, source powers and/or selected gas mixtures to tailor the shape and thickness of the film for desired applications. In one embodiment, a low bias power of below 500 Watts is provided in a first stage HDPCVD and the bias power is then increased to between 500 and 3000 Watts for a second stage to produce a protective film having thin sidewall spacers for enhanced semiconductor device density and a relatively thick cap.

35 Claims, 8 Drawing Sheets

OTHER PUBLICATIONS

Qian et al.; "High Density Plasma Deposition and Deep Submicron Gap Fill with Low Dielectric Constant SIOF Films", DUMIC Conference, Feb. 21–22, 1995, pp. 50–56.

Silicon Processing for the VLSI Era; Chemical Vapor Deposition of Amorphous and Polycrystalline Films, pp. 171–194.

Silicon Processing for the VLSI Era; Dry Etching for VSLI, pp. 539–558.

Silicon Processing for the VLSI Era; Aluminum Thin Films and Physical Vapor Deposition in VLSI, pp. 331–374.

Singer; "The Future of Dielectic CVD: High–Density Plasmas?", Semiconductor International, Jul. 19 97, pp. 127–134.

Gabriel et al.; "Minimizing metal etch rate pattern sensitivity in a high density plasma etcher", J. Vac. Sci. Technol. May/Jun 1997; pp. 697–701.

Lee; "A comparison of HDP sources for polysilicon etching", Solid State Technology, Aug. 1996, pp. 63–69.

Oehriein; "$SiO_1$ Etching in High–Density Plasmas; Differences with Low–Density Plasmas" Plasma Processing of Semiconductors, 1997, pp. 73–88.

Boer et al.; "SiOF and $SiO_2$ deposition in a HDP reactor : tool characterisation and film analysis.", Materials for Advanced Metallization, 1997; pp. 71–73.

Mantei; "High Density Sources for Plamsa Etching", Plasma Processing of Semiconductors, 1997; pp. 137–156.

S. Wolf and R.N. Tauber, Silicon Processing for the VLSI Era, vol. 1–Process Technology, pp. 171–194, Lattice Press, Sunset Beach, CA (1986).

* cited by examiner

COMBINED GATE CAP OR DIGIT LINE AND SPACER DEPOSITION USING HDP

This application is a continuation of U.S. patent application Ser. No. 09/989,036, filed Nov. 21, 2001, now U.S. Pat. No. 6,524,975, which is a divisional of U.S. patent application Ser. No. 09/354,572, filed Jul. 16, 1999, now U.S. Pat. No. 6,368,988, the contents of both being hereby incorporated by reference.

FIELD OF THE INVENTION

This invention relates generally to a method for fabricating integrated circuits. More particularly, the invention relates to a high density plasma process for forming insulating caps and sidewall spacers for word line gate electrodes and interconnects.

BACKGROUND OF THE INVENTION

In the manufacture of integrated circuits, both field-effect transistor gate electrodes and gate electrode interconnects are typically etched from a conductive layer that blankets the in-process circuitry. In semiconductor memory circuits, word lines formed from a uniformly-thick conductive layer which blankets the circuitry form both gate electrodes and gate interconnects. Where a word line passes over a field oxide region, it functions as a gate electrode interconnect; where it passes over a gate dielectric layer that overlies an active area, it functions as a gate electrode. In typical memory circuits, processor circuits and logic circuits, multiple gate electrodes are series coupled by intervening gate interconnects.

FIG. 1 depicts a conventional word line stack 10 of a memory circuit. The word line stack or "gate stack" 10 overlies a silicon substrate 15, which is a small portion of a silicon wafer. Polysilicon layer 11 of word line stack 10 is insulated from the substrate 15 by a gate oxide layer 16. The stack includes a polycrystalline silicon layer 11 and a low resistance metal silicide layer 12. A silicide is a binary compound formed by the reaction of a metal, such as tungston, and silicon at elevated temperature. Also shown in FIG. 1 is a silicon dioxide or silicon nitride capping layer 14.

A typical process for fabricating a word line stack is to grow a gate oxide layer 16 on a lightly-doped silicon substrate 15. Silicon substrate 15 is isolated into active region 17 by field oxide regions 18, as shown in FIG. 1. LOCal Oxidation of Silicon (LOCOS), shallow trench isolation (STI) or other field isolation techniques known in the art are used to provide oxide regions 18 for patterning silicon substrate 15 into active region 17. After isolation of active region 17, gate stack 10, which includes polycrystalline silicon 11 and an overlying silicide layer 12 such as tungsten silicide or other highly conductive materials, and an insulating cap 14 of $SiO_2$ or $Si_3N_4$, are formed by blanket deposition and photolithography. Patterned photoresist is used as an etch mask in forming gate stack 10 and insulating cap 14. In FIG. 1, the patterned photoresist has been removed. Chemical vapor deposition (CVD) of silicon oxide or nitride then provides an insulative spacer layer 19, typically having a thickness in the range of about 200 to 2000 angstroms depending upon device geometry. Spacer layer 19 is next etched with an anisotropic etch, to form a set of sidewall spacers 19 for gate stack 10. Remaining spacer layer 19 coats the sides of the gate stack 10, as shown in FIG. 2.

The conventional process flow for both word line stacks and digit lines therefore requires a capping layer deposition and etch, followed by a separate spacer deposition and etch. What is needed is a process flow requiring fewer fabrication steps for formation of cap 14 and spacer 19, and which also provides the ability to independently tailor the thicknesses and shapes of the caps and spacers for particular semiconductor design applications.

SUMMARY OF THE INVENTION

The present invention provides a method for fabricating gate electrodes and gate interconnects which include protective silicon oxide or silicon nitride caps and spacers. A $SiO_2$ or $Si_3N_4$ film is formed by a high density plasma chemical vapor deposition (HDPCVD) process.

A gate stack or digit line is first blanket deposited and etched, prior to forming a capping layer. Silicon oxide or silicon nitride is then deposited by HDPCVD to simultaneously form a cap and sidewall film of silicon oxide or silicon nitride. The film is deposited in a reaction zone of a high density plasma reactor while applying two or more selected substrate bias powers, source powers and/or gas mixtures, which advantageously permits tailoring the shape and thickness of the film for desired applications. In one preferred embodiment, a low bias power of below 500 Watts is provided in a first stage HDPCVD and the bias power is then increased to between 500 and 3000 Watts for a second stage HDPCVD to fabricate thin sidewall spacers, for enhanced semiconductor device density, and a relatively thick cap, as shown in FIG. 6.

In an alternative embodiment, a gate stack and/or digit line is blanket deposited and etched, and a conventional capping layer and sidewall spacers are then deposited. Subsequently, silicon oxide or nitride is deposited by HDPCVD by the process of the invention including two or more bias and/or source powers and/or gas mixtures to produce a silicon oxide or nitride layer that is relatively thin on vertical surfaces and thicker on horizontal surfaces as shown in FIG. 8. By doing so, the space between the stacks and spacers (x) is increased for the same undoped oxide or barrier thickness (b) at the horizontal surface at the bottom. See FIG. 8. The space between the stacks is then filled with a suitable dielectric such as BPSG.

Preferred embodiments of the invention are described below with reference to the following accompanying drawings.

DETAILED DESCRIPTION OF THE PREFERRED EMBODIMENTS

The present invention will now be described in detail as set forth in the preferred embodiments illustrated in FIGS. 3–8. Although these embodiments depict the invention in its preferred application to specific semiconductor materials, it should be readily apparent that the invention has equal application to any type of material that encounters the same or similar problems. The figures are not meant to be actual cross-sectional views of any particular portion of a real semiconductor device, but are merely convenient tools employed to more fully depict the process aspects of the invention at various stages of manufacture.

The term "substrate" herein shall be understood to mean one or more semiconductive layers or structures which may include active or operable portions of semiconductor devices. Substrates may be any material on which a silicon nitride or silicon dioxide film is desired, e.g., Si wafers, glass or metal objects or films; GaAs layers; or any semiconductor layer or device employing Groups III to V elements or compounds, including, but not limited to, DRAMs and MOS system gates in integrated circuit technology.

Figure 3:
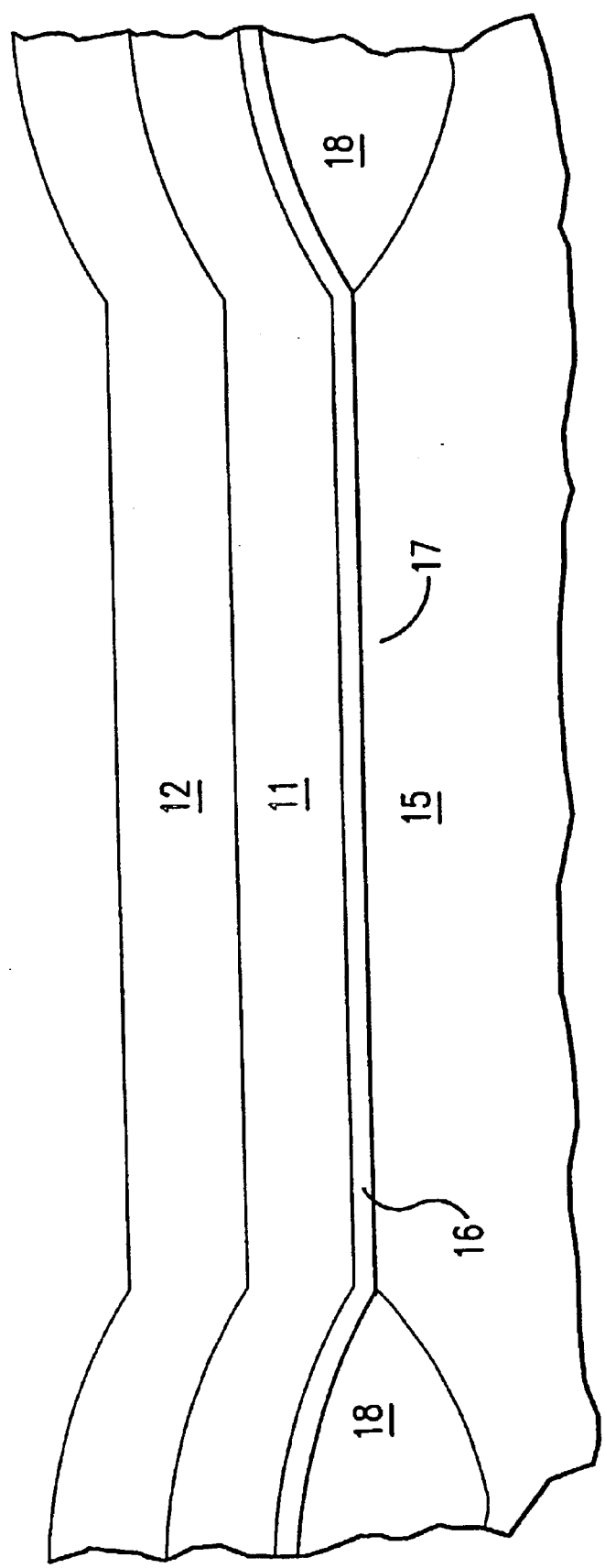
FIG. 3 is a sectional view of a portion of a semiconductor wafer at one processing step in accordance with the invention.

An exemplary construction of a fabrication process for a protected gate stack or digit line in a semiconductor device according to one embodiment of the present invention is described below. This process is only one example of many possible processes. Referring to FIG. 3, silicon substrate 15 is isolated into active region 17 by oxide regions 18. LOCal oxidation of silicon (LOCOS), shallow trench isolation (STI) or other conventional oxidation techniques known in the art are used to provide oxide region 18 for patterning silicon substrate 15 into active region 17.

As an example of a LOCOS process, a silicon nitride layer (not shown) is deposited or thermally grown on a silicon dioxide layer (not shown) which is previously thermally grown on silicon substrate 15. The silicon nitride layer is patterned such that the silicon nitride layer remains only on active region 17. The exposed portions of silicon substrate 15 are thermally oxidized into oxide region 18, and the patterned silicon nitride layer and silicon dioxide layer are selectively etched off of active region 17 of substrate 15.

As an example of an STI process, a silicon nitride layer (not shown) is deposited or thermally grown on a silicon dioxide layer which is previously thermally grown on silicon substrate 15. The silicon nitride layer is patterned such that the silicon nitride layer remains only on active region 17. A silicon trench is then etched to a depth of typically 2–3 times the junction depth of the devices, i.e., about 0.20 to 0.40 micron. The silicon sidewalls and trench bottom are then oxidized to a thickness of about 100–200 angstroms to serve as a liner. Then a high conformal oxide deposition is performed to fill both the trench and the wide open field area. The oxide is subsequently planarized by chemical mechanical polishing (CMP) to the level of the nitride underneath, to expose the nitride.

Figure 4:
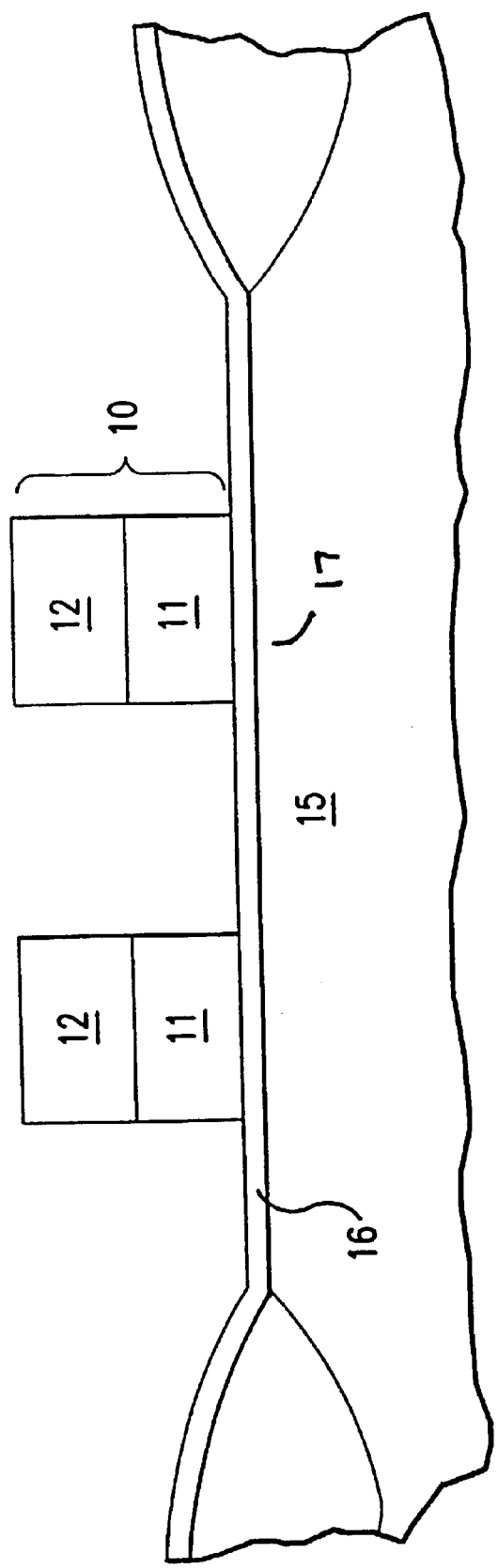
FIG. 4 is a view of the FIG. 3 wafer taken at a step subsequent to that shown by FIG. 3.

As shown in FIG. 4, after isolation of active region 17, insulator 16, lower polysilicon layer 11, and overlying metal or silicide layer 12 such as tungsten silicide, are formed using conventional semiconductor processing techniques known in the art. For instance, a 50 to 400 angstrom layer of oxide 16 is thermally grown on active region 17, and 500 to 5000 angstrom layers of polycrystalline silicon 11 and silicide 12 are then sequentially blanket deposited on oxide 16. Patterned photoresist on silicide 12 is then used as an etch mask in forming structure 10. The gate stacks or digit lines are dry etched by any suitable etching process. In FIG. 4, the patterned photoresist has been removed.

Figure 1:
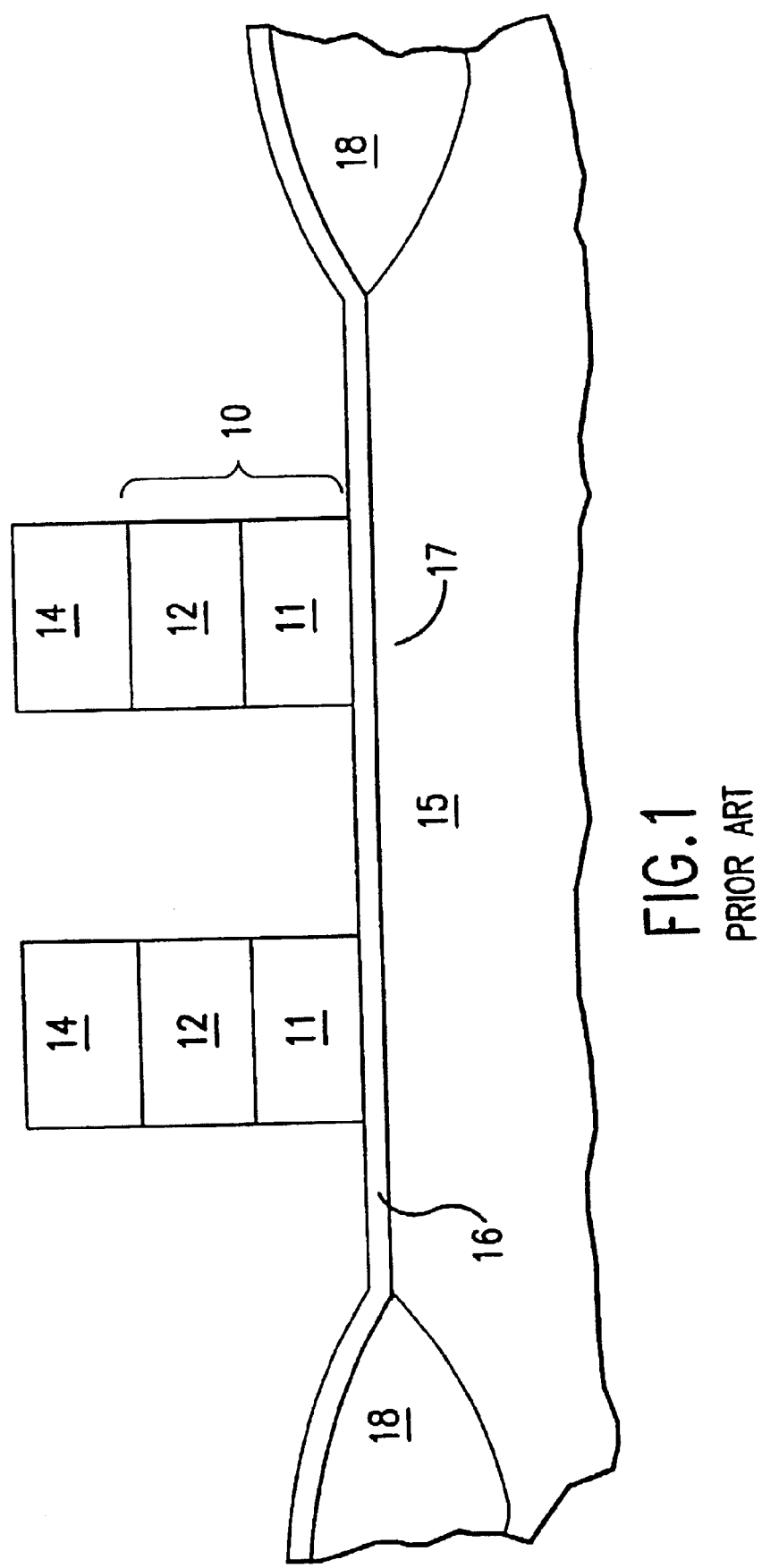
FIG. 1 is a sectional view of a portion of a semiconductor wafer containing conventional gate stacks and caps.
Figure 2:
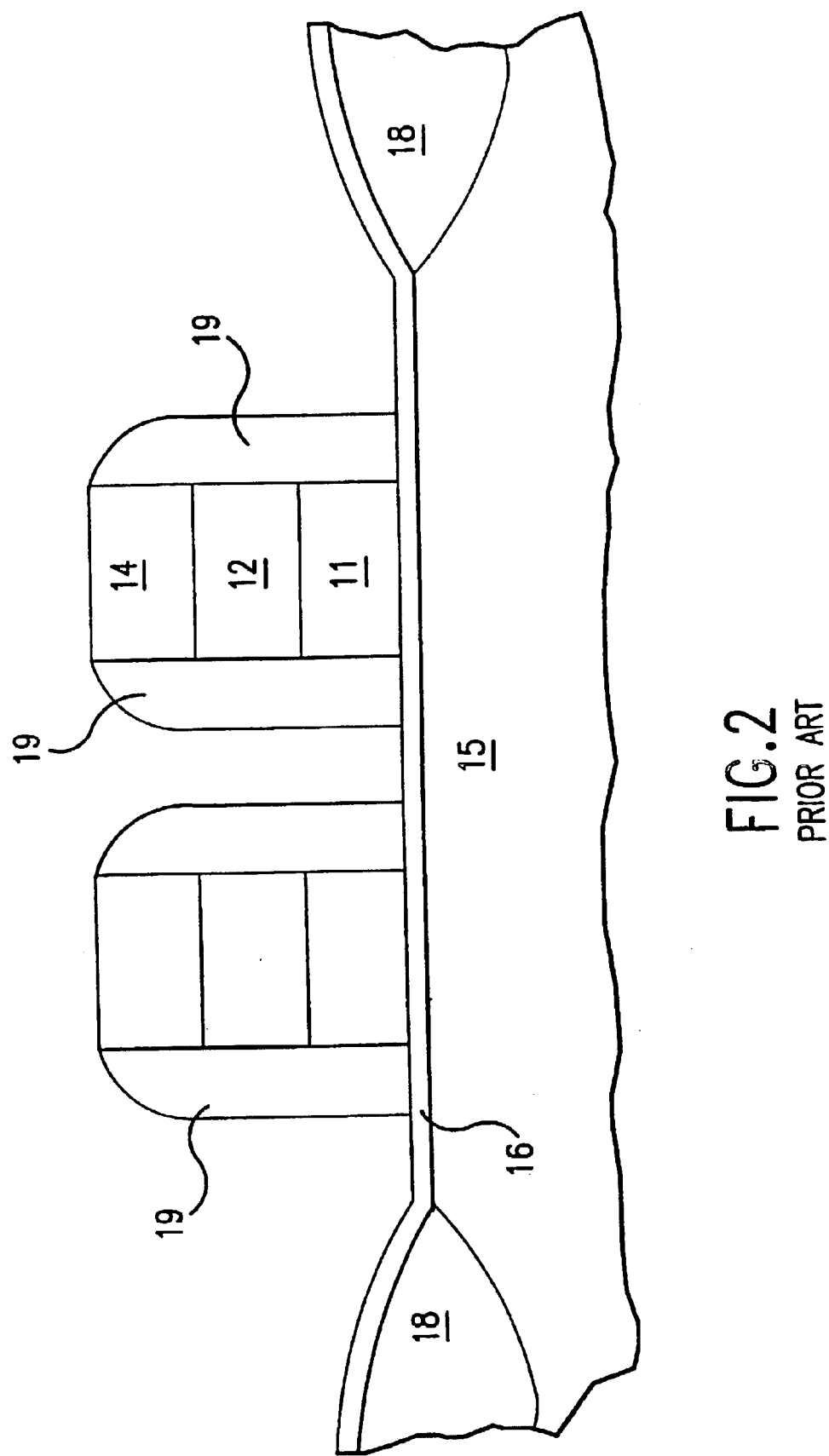
FIG. 2 is a view of the FIG. 1 wafer taken at a step subsequent to that shown by FIG. 1.

Note that unlike the conventional process depicted in FIG. 1, the stack of FIG. 4 does not include a capping layer and no cap layer etch is performed. Moreover, in conventional process flow, after etching the gate stack or digit line cap, a spacer material is then deposited and etched. As shown in FIG. 2, the spacer material is typically anisotropically etched to form spacer 19 of a similar height as the structure 10 and cap 14. These separate capping and spacing steps are avoided by the process of the invention. The gate stack or digit line structure shown in FIG. 4 is one example of a starting point for various embodiments utilizing the HDPCVD process of the present invention for simultaneously forming a protective cap and spacer of silicon nitride or oxide on a gate stack, digit line, or other vertical structure on a semiconductor substrate.

Silicon nitride ($Si_3N_4$) and silicon dioxide ($SiO_2$) are the preferred materials for depositing as cap and sidewall spacers in the method of the present invention. Other silicon nitride-type materials or silicon oxide-type materials, which contain $Si_3N_4$ and/or $SiO_2$ together with one or more other materials, may also be deposited by the process described herein. Silicon nitride has a high dielectric strength, excellent barrier properties against impurity diffusion, and good chemical stability. Silicon dioxide has good insulating properties and is also chemically stable for these applications. The HDPCVD process of this invention may be used to produce $Si_3N_4$ or $Si_3N_4$-type films. The HDPCVD process of this invention may also be used to produce $SiO_2$ or $SiO_2$-type films such as BSG, PSG, BPSG, and etc.

Although there are some differences in the way various HDPCVD systems are designed, from the type of plasma source used to the way the reaction chamber is cleaned, all work in fundamentally the same way. Each functions to provide a simultaneous deposition and etching action. A high-density plasma source—inductively coupled plasma (ICP), electron cyclotron resonance (ECR) or Helicon, for example—excites a gas mixture that includes, for example, oxygen and argon. In the method of the invention, an inductively coupled plasma source is preferred. Source power is typically in the range of about 2000 to about 3000 W, but any suitable power may be used provided the gas mixture is sufficiently excited to conduct HDPCVD. A magnetic field may be applied to the substrate, but it is not necessary. In the method of the invention, preferably two or more different bias powers are applied to the substrate to pull the energetic ions out of the plasma and direct them at the substrate surface: the oxygen, for example, reacts with silane ($SiH_4$) to form $SiO_2$, while the argon acts to sputter deposited material away. Typically, a 13.56 MHz RF source is used to apply a bias voltage between the substrate and the plasma, but the process of the invention is not limited to use of any particular RF frequency. Furthermore, the process may also be carried out using two or more different source powers and constant bias power or in conjunction with two or more different bias powers.

The ICP or other high-density plasma source maintains a high ion density even at the relatively low pressures (a few mTorr) needed to obtain the directionality required for tailoring the cap and spacer for desired applications (at higher pressures, there are too many collisions between radicals to maintain good directionality). The etch/deposition (E:D) ratio—typically kept in the range of between 0.14–0.33—is controlled by the ratio of the gases, the chamber pressure, and the RF bias on the substrate. The reaction chamber pressures are controlled in the range of from about 0.1 millitorr (mTorr) to about 100 millitorr. The preferred range is from about 5 to about 15 millitorr for both dioxide and nitride formation, more preferably about 7–8 millitorr.

The substrate with, for example, stack 10 as shown in FIG. 4, is placed in a HDP reaction chamber, typically on an electrostatic chuck (ESC). The low pressures used and the need for effective wafer cooling to maintain the temperature in the range of about 350° C. to 650° C. make electrostatic chucks (ESCs) preferable. Helium backside cooling may be used to remove excess thermal energy from the simultaneous argon or other noble element sputtering. The reaction gases may be introduced into the reaction chamber by separate inlet lines, or they may be premixed in a mixing manifold. The reaction gases are introduced in a substantially laminar flow over the substrate surface. The residence time over the substrate is preferably kept short to eliminate substantial concentration variations over the substrate.

For deposition of silicon nitride ($Si_3N_4$) or silicon dioxide ($SiO_2$) films, any gaseous silicon compound or complex may be used. Silane ($SiH_4$) is generally preferred as the gaseous silicon source. Other silicon containing chemicals that may be used as silicon sources include, for example, silicon tetrachloride ($SiCl_4$), silicon tetrabromide ($SiBr_4$), silicon tetrafluoride ($SiF_4$), dichlorosilane ($SiH_2Cl_2$), disilane ($Si_2H_6$) and di-tert-butylsilane (DTBS). Other chemicals, such as tetramethylorthosilicate [TMOS $Si(OCH_3)_4$], tetraethylorthosilicate [TEOS, $Si(OC_2H_5)_4$] and tetramethylcyclotetrasiloxane (TMCTS, $C_4H_{16}Si_4O_2$), may also be used for oxide deposition.

Useful gas flow rates are on the order of from about 40 to about 400 standard cc/min. (sccm) for the silane or other silicon compound (preferably about 150 sccm), and from about 60 sccm to 500 sccm for the other reactant gas or gases capable of reacting with the silicon compound to form silicon nitride (e.g., anhydrous ammonia, $N_2$, hydrazine, or mixtures thereof) or to form silicon dioxide (e.g., oxygen, ozone, nitrous oxide, nitric oxide or mixtures thereof). The preferred gas flow rate is about 250 sccm for these other, non-silicon, reactant gases.

The flow rate of the noble gas, preferably argon or helium, is in the range of from about 60 to about 500 sccm. The preferred noble gas flow rate is about 200 sccm.

The present invention provides a more efficient fabrication process for forming word line or buried digit line caps and spacers, but also provides the unique ability to control how the thickness of the deposited layer varies along bottom, sidewall, and top surfaces of high aspect ratio features patterned on an integrated circuit. The HDPCVD process of the invention is carried out under two or more separate sets of process conditions (source power, bias power, and/or gas flow rate) for each gate stack or digit line. The preferred difference between the two separate sets of conditions is the amount of bias applied to the substrate. Thus, each substrate is subject to a relatively low or zero bias HDPCVD process and also to a relatively high bias HPCVD process. The substrate need not be removed from the reaction zone and the gas flow rates need not be changed for the second stage of the HDPCVD process. The bias is either increased or decreased, resulting in the deposition of a second layer of silicon oxide or nitride film and a change in the morphology or shape of the resulting overall film. Alternatively, each substrate is subject to a relatively low source power and also to a relatively high source power, which also results in deposition of a second layer and a change in film morphology. When the source power is varied between first and second stage processes, the bias power and/or gas flow rate need not be changed.

A process flow will now be described in which the $SiO_2$ or $Si_3N_4$ cap and spacer will be simultaneously deposited by HDPCVD and wherein the cap will be relatively thick as compared to the sidewall spacers. Thinner sidewall spacers are preferred for many applications, particularly high density DRAM and other memory cell arrays. Preferably, the resulting cap and bottom layer of film have thicknesses in the range of from about 1000 to about 3000 angstroms, while the spacer film on the gate stack or digit line sidewalls has a thickness in the range of from about 100 to about 900 angstroms. More preferably, the cap has a thickness of about 2000 to about 3000 angstroms and the sidewall spacers have a thickness of about 300–800 angstroms.

Figure 5:
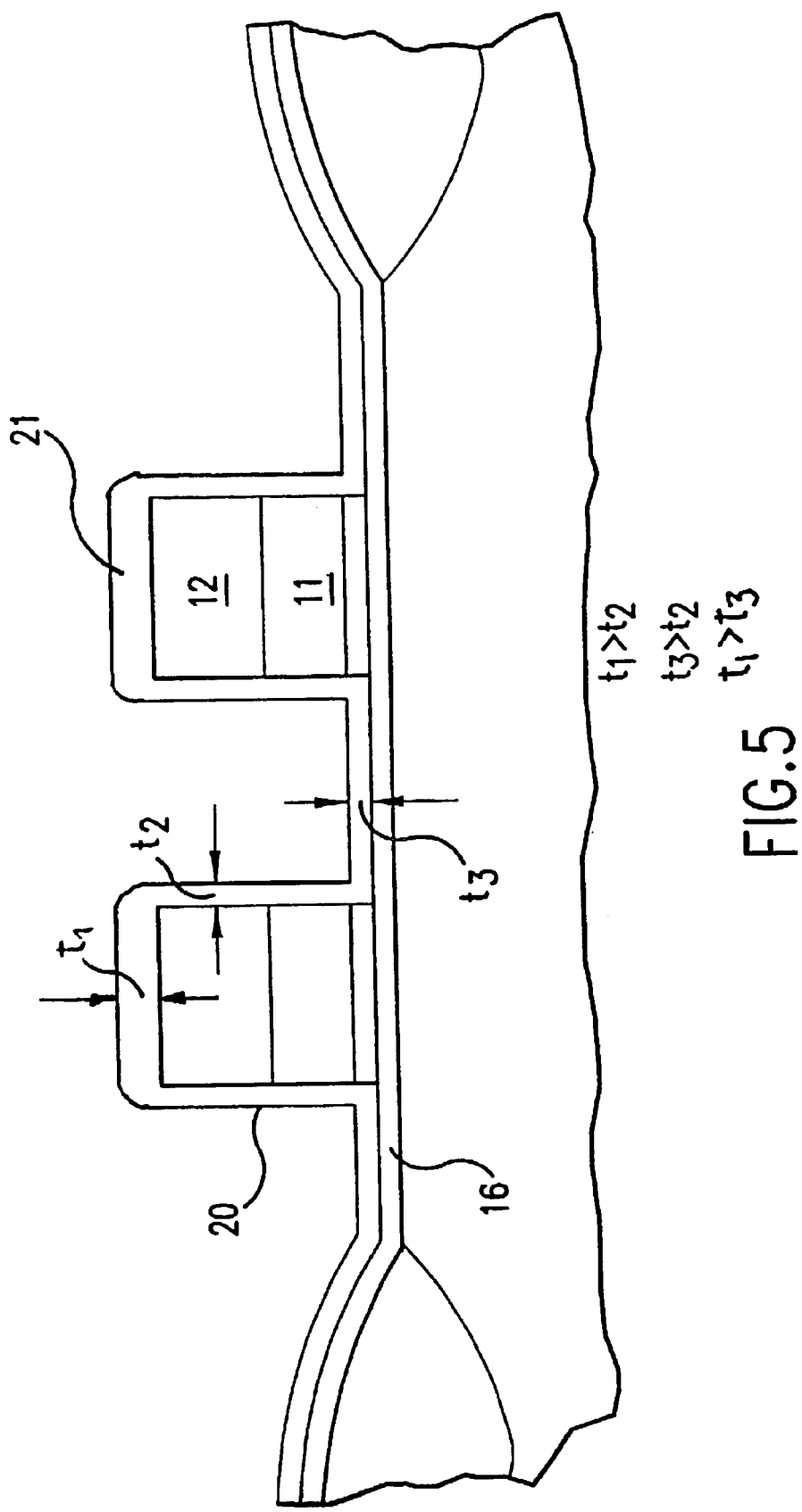
FIG. 5 is a view of the FIG. 3 wafer taken at a step subsequent to that shown by FIG. 4.

To begin deposition, silane or another silicon compound, together with ammonia, $N_2$ or hydrazine where silicon nitride-type films are desired, or together with oxygen, nitrous oxide ($N_2O$), ozone, or nitric oxide (NO) in the case of where a silicon dioxide-type film is desired, are introduced through an inlet in the HDPCVD reaction zone and passed through the plasma and over the substrate. The substrate is biased with a relatively low bias power in the range of about 10 to 500 Watts. The plasma quickly forms either a silicon nitride film or silicon dioxide film 20 on the substrate. The morphology of the film formed from this first set of HDPCVD conditions is generally as shown in FIG. 5, and may include the characteristic relatively pointed or "overhang" feature on the cap, which overhang configuration on raised (elevated) horizontal surfaces of the substrate is a result of the simultaneous deposition and sputtering, but more preferably has a flatter configuration 21 on the cap as shown in FIG. 5. As shown in FIG. 5, the film thickness ($t_1$) on the raised horizontal surface of gate stack or digit line 10 is greater than the film thickness ($t_2$) on the verticle surfaces and on the bottom horizontal surfaces ($t_3$) of the opening. In addition, thickness ($t_3$) is also greater than ($t_2$), and ($t_1$) is greater than ($t_2$).

Figure 6:
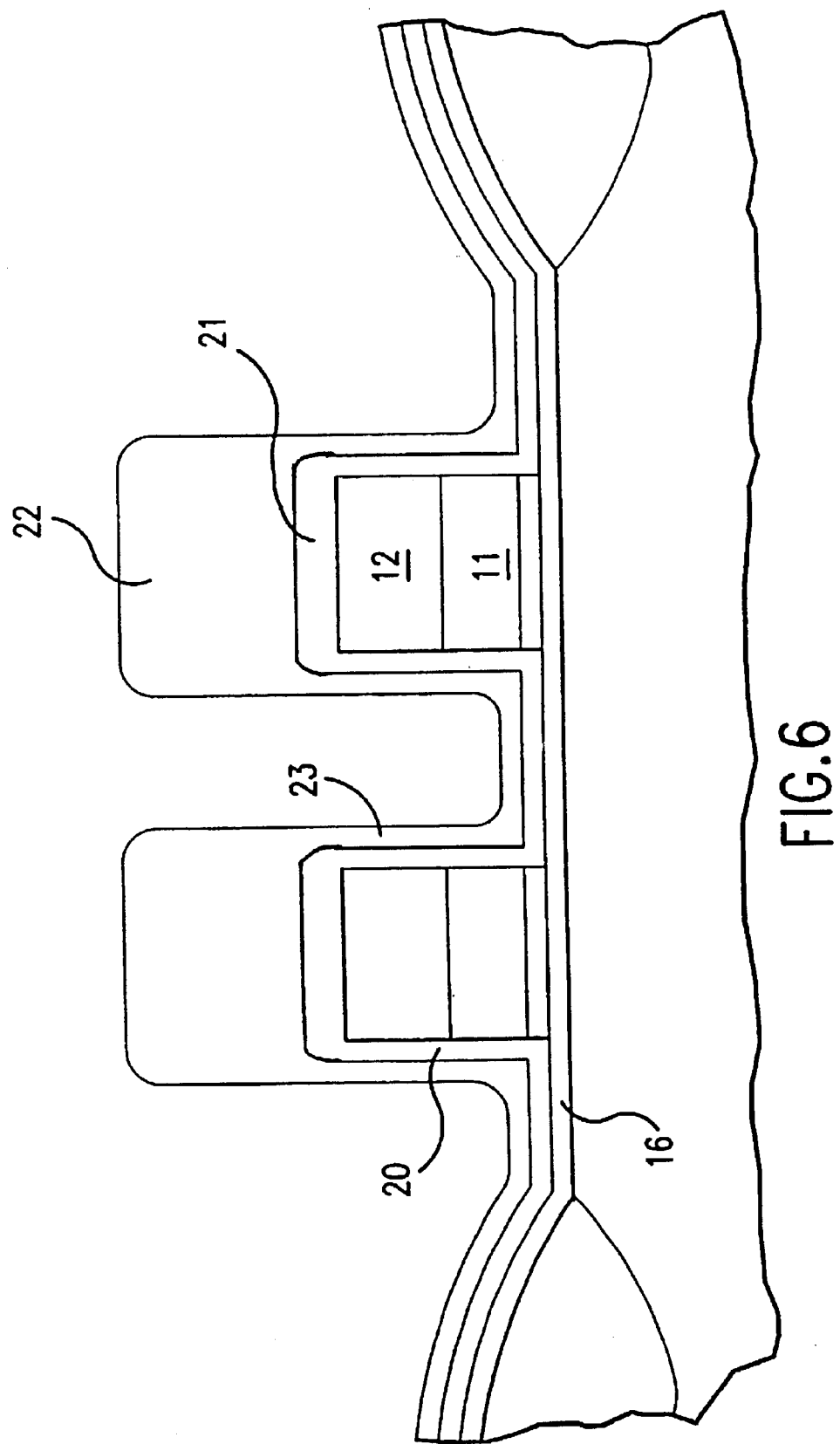
FIG. 6 is a view of the FIG. 3 wafer taken at a step subsequent to that shown by FIG. 5.

The bias power is then increased to a power within the range of about 500 to 3000 Watts. The substrate need not be removed from the reaction zone between the two HDPCVD process stages, and the gases and flow rates need not be changed from the rates specified above. The resulting morphology of the film 23 is then as shown in FIG. 6, which shows a buildup of the cap 22 thickness. In addition to increasing the bias, the flow rate of silane or other silicon compound gas may also be decreased or shut off for this second stage of the HDPCVD process, thus further enhancing the resulting morphology of thick flat cap 22 and thin sidewall spacers. Similarly, the source power may also be varied between, e.g., about 2000 and 3000 W to further enhance the resulting morphology. In an alternative embodiment, the bias power is maintained at about 1000 Watts but the source power is varied from a high power first stage of about 3000 W to a low power second stage of about 2000 Watts.

Figure 7:
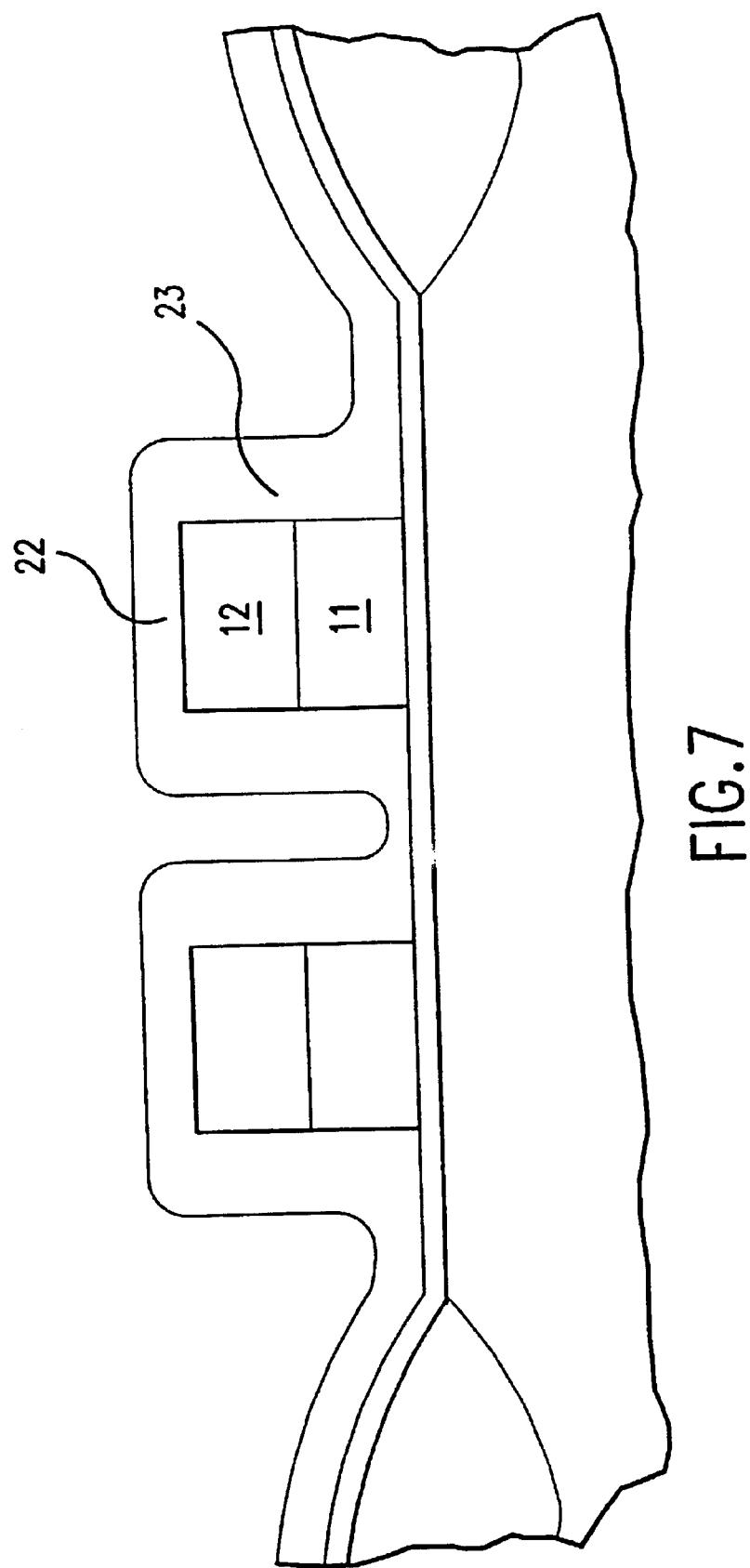
FIG. 7 is a view of an alternative embodiment showing the FIG. 3 wafer taken at a step subsequent to that shown by FIG. 4.

Various other cap and spacer configurations can be formed by controlling the bias power, source power, and/or silicon gas flow rate. By increasing the bias power, the thickness of the cap increases relative to the thickness of the sidewall spacers. By increasing the silicon compound gas flow rate, the thickness of the sidewall spacers increases relative to the cap. The process variables, bias and source power and silicon flow rate, can be independently varied to control the film shape and thickness of the cap and spacer, i.e., the horizontal and vertical features. It is also readily apparent that the process of the invention may be used to provide a cap of relatively lesser thickness and spacers of relatively greater thickness as shown in FIG. 7, or a cap and spacers of the same thicknesses, depending on the particular design criteria of a given semiconductor application.

The film formation rate is typically in the range of from about 10 to about 500 angstroms per minute with typical operating rates being on the order of from about 30–300 angstroms per minute, with the optimum being about 100–200 angstroms per minute at a pressure of about 7–8 mTorr at about 600° C. This provides a growth rate sufficiently moderate to be controllable yet sufficiently high to be suitable for commercial production.

The high-density plasma chemical vapor deposition (HDPCVD) process of the invention has several advantages compared to competing technologies. It deposits a hard, high-quality material that has good thermal conductivity and etch characteristics similar to those of thermal oxides or nitrides. Moreover, the caps and spacers may be formed simultaneously without any need to alter deposition or etch chemistries. In addition, the shape of the protective film may be controlled and modified by merely adjusting two knobs on a typical HDPCVD reactor, e.g., bias power and silane flow rate.

Figure 8:
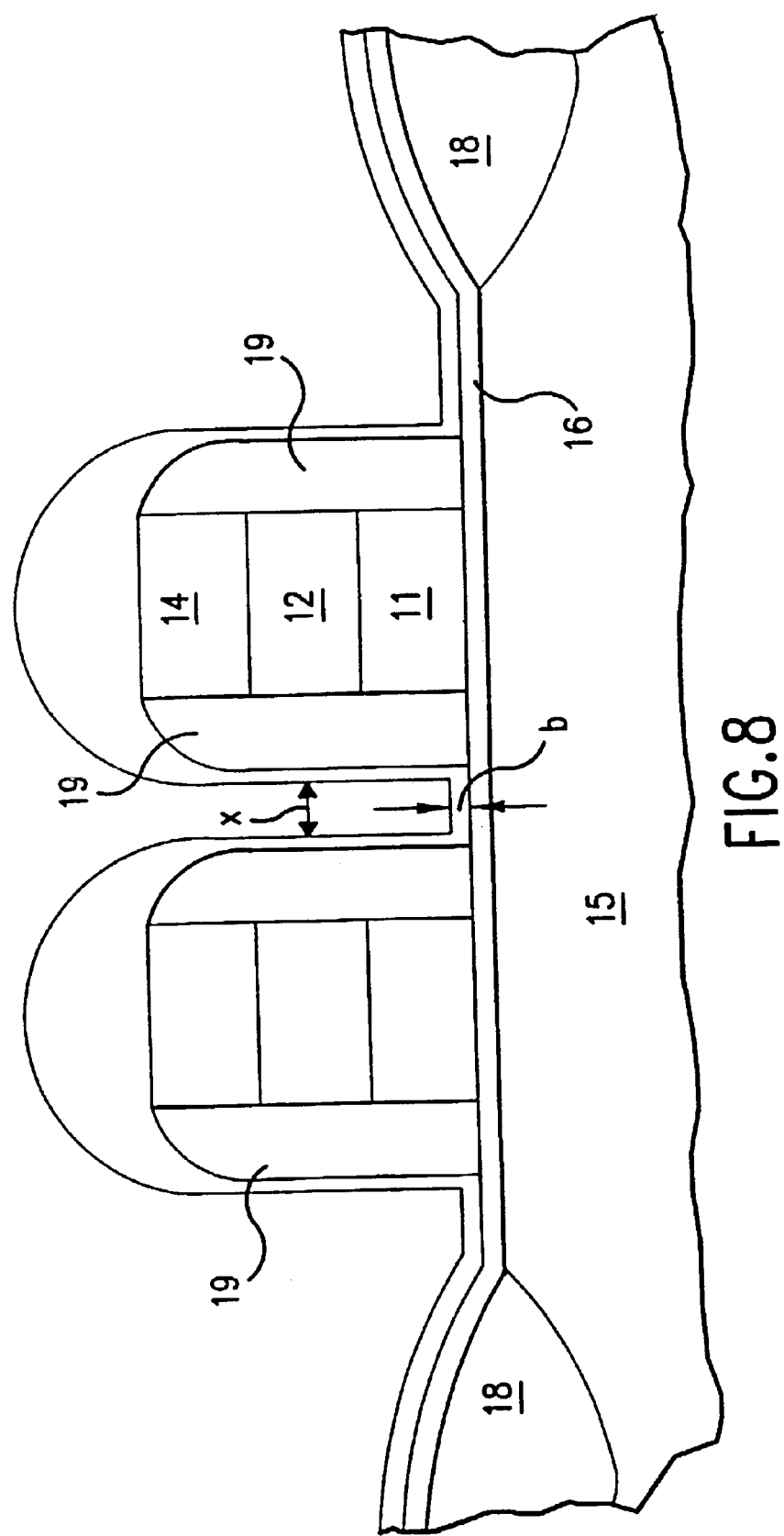
FIG. 8 is a view of an alternative embodiment showing the FIG. 2 wafer taken at a step subsequent to that shown by FIG. 2.

In an alternative embodiment, a gate stack and/or digit line is blanket deposited and etched, and a conventional capping layer and sidewall spacers are then deposited in the conventional multiple step manner. Subsequently, silicon oxide or nitride is deposited by HDPCVD by the above process using two or more bias and/or source powers and/or gas mixtures to produce a silicon oxide or nitride layer having the configuration as shown in FIG. 8. By doing so, the space between the stacks and spacers (x) may be increased for the same undoped oxide or barrier thickness (b) at the horizontal surface at the bottom. As can be seen in FIG. 8, a relatively thin silicon oxide or nitride layer is thus deposited on the vertical surfaces while a relatively thicker layer is deposited on the horizontal surface between the spacers. The space between the stacks is then filled with a dielectric such as BPSG.

Although several embodiments of the improved processes have been described herein, it will be apparent to one skilled in the art that changes and modifications may be made thereto without departing from the spirit and the scope of the invention as claimed. Accordingly, it is to be understood that although the present invention has been described with reference to preferred embodiments, various modifications, known to those skilled in the art, may be made to the structures and process steps presented herein without departing from the invention which is defined in the claims appended hereto.

We claim:

1. A process for forming a silicon nitride or silicon oxide film on a semiconductor substrate, comprising:
    forming vertical surfaces and horizontal surfaces on said substrate, said horizontal surfaces including raised horizontal surfaces above a base plane of said substrate;
    disposing said substrate within a reaction zone of a high density plasma reactor;
    during a first stage of said process, performing the acts of:
        applying a source power to a plasma source in said reactor to generate a high density plasma in said reaction zone,
        introducing a gas mixture containing a silicon compound and at least one other reactant gas capable of reacting with said silicon compound to form either silicon nitride or silicon oxide into said reaction zone, and passing said gas mixture into contact with said substrate while exciting said gas mixture with a high density plasma, and
        biasing said substrate with a bias power to form a layer of silicon dioxide or silicon nitride on said vertical and horizontal surfaces of said substrate; and
    during a second stage of said process, continuing to form said layer of silicon dioxide or silicon nitride on said vertical and horizontal surfaces of said substrate, while selectively controlling the thicknesses of said layer of silicon dioxide or silicon nitride film formed on said vertical surfaces and said horizontal surfaces, independently, by changing at least one of said bias power, said source power, and a flow rate of said gas mixture.

2. The process according to claim 1, wherein in the second stage of said process, the thicknesses of said layer of silicon dioxide or silicon nitride formed on said vertical surfaces and said horizontal surfaces are independently controlled by changing said bias power.

3. The process according to claim 1, wherein in the second stage of said process, the thicknesses of said layer of silicon dioxide or silicon nitride formed on said vertical surfaces and said horizontal surfaces are independently controlled by changing said source power.

4. The process according to claim 1, wherein in the second stage of said process, the thicknesses of said layer of silicon dioxide or silicon nitride formed on said vertical surfaces and said horizontal surfaces are independently controlled by changing a flow rate of said gas mixture.

5. The process according to claim 1, wherein said bias power applied in said second stage is increased relative to said bias power applied in said first stage to thereby selectively increase the thickness of said layer of silicon dioxide or silicon nitride formed on said raised horizontal surfaces of said substrate relative to the thickness of said layer formed on said vertical surfaces.

6. The process according to claim 1, wherein said bias power applied in said first stage is within the range of from about 10 W to about 500 W and said bias power applied in said second stage is within the range of from about 500 W to about 3000 W to thereby selectively increase the thickness of said layer of silicon dioxide or silicon nitride formed on said raised horizontal surfaces of said substrate relative to the thickness of the layer formed on said vertical surfaces.

7. The process according to claim 1, wherein a flow rate of said silicon compound containing gas mixture is decreased in said second stage relative to a flow rate of said silicon compound containing gas mixture in said first stage to thereby selectively increase the thickness of said layer of silicon dioxide or silicon nitride formed on said raised horizontal surfaces of said substrate relative to the thickness of the layer formed on said vertical surfaces.

8. The process according to claim 1, wherein said bias power is applied at about 1000 W in both said first and second stages, and said source power is applied at about 3000 W in said first stage and at about 2000 W in said second stage to thereby selectively increase the thickness of said layer of silicon dioxide or silicon nitride formed on said raised horizontal surfaces of said substrate relative to the thickness of the layer formed on said vertical surfaces.

9. The process according to claim 1, wherein said forming vertical surfaces and horizontal surfaces on said substrate is performed by patterning said substrate.

10. The process according to claim 1, wherein said forming said vertical surfaces and said horizontal surfaces on said substrate is performed by forming at least one structure on said base plane of said substrate.

11. The process according to claim 1, wherein said forming of said vertical surfaces and said horizontal surfaces on said substrate is performed by isolating an active region on said semiconductor substrate and forming at least one of a gate stack and a digit line on said active region.

12. The process according to claim 11, wherein said at least one of a gate stack and a digit line is formed by blanket deposition and etching, and includes forming sidewall spacers thereon.

13. The process according to claim 1, wherein said source power is applied to about 2000 W to about 3000 W in both said first stage and said second stage of said process.

14. The process according to claim 1, wherein said gas mixture is introduced into said reaction zone with a flow rate in the range of from about 40 sccm to about 400 sccm for said silicon compound.

15. The process according to claim 1, wherein said gas mixture is introduced into said reaction zone with a flow rate in the range of from about 60 sccm to about 500 sccm for said at least one other reactant gas.

16. The process according to claim 1, wherein said gas mixture is introduced into said reaction zone with a flow rate in the range of from about 40 sccm to about 400 sccm for said silicon compound and a flow rate of in the range of from about 60 sccm to about 500 sccm for said at least one other reactant gas.

17. The process according to claim 16, wherein said gas mixture is introduced into said reaction zone with a flow rate of about 150 sccm for said silicon compound and a flow rate of about 250 sccm for said at least one other reactant gas.

18. The process according to claim 1, wherein said silicon compound in said gas mixture comprises a compound selected from the group consisting of silane ($SiH_4$), silicon tetrachloride ($SiCl_4$), silicon tetrabromide ($SiBr_4$), silicon tetrafluoride ($SiF_4$), dichlorosilane ($SiH_2Cl_2$), disilane ($SiH_6$) and di-tert-butylsilane (DTBS), tetramethylorthosilicate (TMOS $Si(OCH_3)_4$), tetraethylorthosilicate (TEOS, $Si(C_2H_5)_4$) and tetramethylcyclotetrasioxane (TMCTS, $C_4Hl_6Si_4O_2$).

19. The process according to claim 18, wherein said silicon compound comprises silane ($SiH_4$).

20. The process according to claim 1, wherein said at least one other reactant gas in said gas mixture is capable of reacting with said silicon compound in said gas mixture to form silicon nitride and is selected from the group consisting of ammonia, $N_2$, hydrazine, and mixtures thereof.

21. The process according to claim 1, wherein said at least one other reactant gas in said gas mixture is capable of reacting with said silicon compound in said gas mixture to form silicon dioxide and is selected from the group consisting of oxygen, nitrous oxide ($N_2O$), ozone, nitric oxide (NO), and mixtures thereof.

22. The process according to claim 1, wherein said bias power in both said first stage and said second stage of said process is applied using a 13.56 MHz RF source.

23. The process according to claim 1, further comprising applying a magnetic field to said substrate in at least one of said first stage and said second stage of said process.

24. The process according to claim 1, further comprising maintaining the pressure in said reaction zone to be in a range of from about 0.1 millitorr to about 100 millitorr.

25. The process according to claim 24, wherein the pressure in said reaction zone is maintained to be in a range of from about 5 millitorr to about 15 millitorr.

26. The process according to claim 24, wherein the pressure in said reaction zone is maintained to be in a range of from about 7 millitorr to about 8 millitorr.

27. The process according to claim 1, further comprising maintaining the temperature in said reaction zone to be in a range of from about 350° C. to about 650° C.

28. The process according to claim 1, wherein said substrate is disposed within said reaction zone on an electrostatic chuck.

29. The process according to claim 1, wherein said high density plasma is generated by inductive coupling.

30. The process according to claim 1, wherein the layer of silicon oxide or silicon nitride formed on said raised horizontal surfaces of said substrate has a thickness in the range of from about 1000 angstroms to about 3000 angstroms.

31. The process according to claim 1, wherein the layer of silicon oxide or silicon nitride formed on said raised horizontal surfaces of said substrate has a thickness in the range of about 2000 angstroms to about 3000 angstroms.

32. The process according to claim 1, wherein the layer of silicon oxide or silicon nitride formed on said vertical surfaces of said substrate has a thickness in the range of about 100 angstroms to about 900 angstroms.

33. The process according to claim 1, wherein the layer of silicon oxide or silicon nitride formed on said vertical surfaces of said substrate has a thickness in the range of about 300 angstroms to about 800 angstroms.

34. The process according to claim 1, wherein the layer of silicon nitride or silicon dioxide formed during said first stage forms an overhang on each raised horizontal surface of said substrate.

35. The process according to claim 34, wherein said overhang formed on each raised horizontal surface in said first stage is removed during said second stage by said selective controlling.

* * * * *